(12) United States Patent
Kim et al.

(10) Patent No.: US 7,791,048 B2
(45) Date of Patent: Sep. 7, 2010

(54) ION IMPLANTING APPARATUS AND METHOD FOR IMPLANTING IONS

(75) Inventors: Deok-Hoi Kim, Gyeonggi-Do (KR); Chung Yi, Gyeonggi-Do (KR)

(73) Assignee: Samsung Electronics Co., Ltd. (KR)

( * ) Notice: Subject to any disclaimer, the term of this patent is extended or adjusted under 35 U.S.C. 154(b) by 414 days.

(21) Appl. No.: 11/970,755

(22) Filed: Jan. 8, 2008

(65) Prior Publication Data
US 2008/0191154 A1 Aug. 14, 2008

(30) Foreign Application Priority Data
Feb. 8, 2007 (KR) .................. 10-2007-0013111

(51) Int. Cl.
*G21K 5/10* (2006.01)
(52) U.S. Cl. .................. 250/492.21; 250/492.1; 250/492.2; 250/492.3
(58) Field of Classification Search .............. 250/492.1, 250/492.2, 492.21, 492.3
See application file for complete search history.

(56) References Cited
FOREIGN PATENT DOCUMENTS

| JP | 11-086775 | 3/1999 |
|----|-----------|--------|
| KR | 1998-0078293 | 11/1998 |
| KR | 1020050008222 A | 1/2005 |

*Primary Examiner*—Jack I Berman
*Assistant Examiner*—Hanway Chang
(74) *Attorney, Agent, or Firm*—Cantor Colburn LLP

(57) ABSTRACT

In an ion implanting apparatus and a method for implanting ions are provided. The ion implanting apparatus includes an ion source part, a substrate holding part, a beam current adjusting part, a doping quantity measuring part, and an ion beam control part. The ion source part generates an ion beam. The ion beam is irradiated onto the substrate and the ions are implanted into the substrate. The beam current adjusting part is disposed between the ion source part and the substrate holding part, to adjust a beam current. The doping quantity measuring part is disposed on substantially the same surface as the substrate, to measure ion doping quantity. The ion beam control part is connected to the doping quantity measuring part, to control the ion source part and the beam current adjusting part.

19 Claims, 9 Drawing Sheets

ION IMPLANTING APPARATUS AND METHOD FOR IMPLANTING IONS

This application claims priority to Korean Patent Application No. 2007-13111, filed on Feb. 8, 2007, and all the benefits accruing therefrom under 35 U.S.C. 119, the contents of which in its entirety are herein incorporated by reference.

BACKGROUND OF THE INVENTION

1. Field of the Invention

The present invention relates to an ion implanting apparatus and method for implanting ions. More particularly, the present invention relates to an ion implanting apparatus capable of controlling an ion beam in real time and a method for implanting ions.

2. Description of the Related Art

Generally, a liquid crystal display ("LCD") apparatus includes an LCD panel having a thin-film transistor ("TFT") substrate on which a TFT is arranged in a matrix shape and displays an image.

The TFT includes a multi-layered structure having a semiconductor material such as amorphous silicon (a-Si) or poly-silicon (poly-Si). Ions are implanted into an a-Si layer or a poly-Si layer by a separate ion implanting apparatus.

The ion implanting apparatus continuously irradiates an ion beam having the ions onto the TFT substrate. Thus, the ion implanting apparatus implants ions into the TFT substrate.

The ion beam needs to have a substantially constant beam current, so that the ions are uniformly implanted into the TFT substrate regardless of the position. To achieve this end, the ion implanting apparatus includes a beam scanning part and a beam current adjusting part that scans the ion beam to adjust a beam current before the ions are implanted into the TFT substrate.

In addition, the ion implanting apparatus includes a doping quantity measuring part to confirm that the TFT substrate is implanted with a predetermined doping quantity to meet user's demands. The doping quantity measuring part is disposed under the substrate and is measured after the ions are implanted into the TFT substrate.

However, the beam current of the ion beam is not uniform and the ion doping quantity is not measured during implantation of ions into the substrate, so that the ion implanting apparatus may generate a defect during the implanting process.

BRIEF SUMMARY OF THE INVENTION

Aspects of the present invention include an ion implanting apparatus controlling an ion beam in real time to prevent defects caused in an implanting process.

Further aspects of the present invention include a method for implanting ions.

In an exemplary ion implanting apparatus according to the present invention, the ion implanting apparatus includes an ion source part, a substrate holding part, a beam current adjusting part, a doping quantity measuring part and an ion beam control part. The ion source part generates an ion beam. The substrate holding part holds a substrate onto which the ion beam is irradiated. Ions are implanted into the substrate held by the substrate holding part. The beam current adjusting part is disposed between the ion source part and the substrate holding part, to adjust a beam current according to a position of the ion beam. The doping quantity measuring part is disposed on substantially the same surface as the substrate, to measure ion doping quantity in real time. The ion beam control part is connected to the doping quantity measuring part, to control the ion source part and the beam current adjusting part according to the ion doping quantity.

The doping quantity measuring part may include a plurality of first measurement cells disposed along a first side of the substrate substantially parallel with a scanning direction of the ion beam, and a plurality of second measurement cells disposed along a second side of the substrate opposite to the first side of the substrate. The first and second measurement cells may be substantially symmetric with respect to a central axis of the substrate substantially parallel with the scanning direction.

In addition, the first and second measurement cells may respectively output first and second measured values that are dependent on the ion doping quantity. The first and second measured values may be outputted as voltage.

The ion beam control part may include a beam current control part through which a first difference between the first and second measured values corresponding to substantially the same ion beam is fed back to the beam current adjusting part. The beam current adjusting part may include a plurality of magnetic poles enclosing the ion beam and applying a magnetic force differently based on the first difference, to uniformly maintain the beam current according to the position of the ion beam.

In addition, the ion beam control part may further include an ion quantity control part through which a second difference between an average of the first and second measured values corresponding to substantially the same ion beam and a predetermined reference is fed back to the ion source part.

The ion source part may include a gas injection part injecting a reactive gas differently based on the second difference, an ion generating part generating the ions from the reactive gas, and an ion beam generating part classifying the ion based on a mass to generate the ion beam.

The ion implanting apparatus may further include a beam scanning part scanning the ion beam to uniformize the beam current according to the position of the ion beam, so that the ion beam is fed back to the beam current adjusting part before the ions are implanted into the substrate.

The ion implanting apparatus may further include first and second measurement cell holding parts respectively holding the first and second measurement cells, and a transferring apparatus transferring the substrate holding part and the first and second measurement cells at the same time.

When the first and second measurement cell holding parts are fixed to the substrate holding part, the transferring apparatus may include a driving part, and a power transmitting part transmitting the power of the driving part, to transfer the substrate holding part into a direction substantially opposite to the scanning direction. The driving part may include one of a driving motor and a cylinder.

Alternatively, when the first and second measurement cell holding parts are separated from the substrate holding part, the transferring apparatus may include a driving part, and first, second and third power transmitting parts transmitting the power of the driving part, to respectively transfer the first and second measurement cell holding parts and the substrate holding part into a direction substantially opposite to the scanning direction at the same time.

In an exemplary method for implanting ions according to the present invention, an ion beam is generated. An ion doping quantity is measured in real time in irradiating the ion beam to a substrate. A beam current is controlled based on the measured doping quantity according to a position of the ion beam. Ion quantity of the ion beam may be controlled based on the measured doping quantity.

The ion doping quantity may be measured by measuring a first measured value at a first side of the substrate parallel with a scanning direction of the ion beam, outputting the first measured value, measuring a second measured value at a second side of the substrate opposite to the first side of the substrate, and outputting the second measured value.

In addition, the beam current according to the position of the ion beam may be controlled by uniformizing the beam current according to the position of the ion beam in real time through a difference between the first and second measured values. The ion beam may be uniformized by applying a lower intensity of a magnetic force to a position where a higher ion doping quantity is measured than the previous position, and applying a higher intensity of the magnetic force to a position where a lower ion doping quantity is measured than the previous position.

In addition, the ion quantity of the ion beam may be controlled by changing the ion quantity of the ion beam in real time through a difference between an average of the first and second measured values corresponding to substantially the same ion beam and a predetermined reference. The ion quantity of the ion beam may be controlled by generating the ion quantity more when the average is lower than the predetermined reference, and generating the ion quantity less when the average is higher than the predetermined reference.

The beam current may be measured and adjusted according to the position of the ion beam to increase uniformity of the ion beam before the ion beam is irradiated onto the substrate.

According to the present invention, a doping quantity measuring part is disposed on substantially the same surface as a substrate, and an ion beam control part connected to the doping quantity measuring part controls an ion beam based on the measured doping quantity in real time, so that defects generated when implanting ions into the substrate may be prevented.

BRIEF DESCRIPTION OF THE DRAWINGS

The above and other aspects, features, and advantages of the present invention will become more apparent by describing in detailed exemplary embodiments thereof with reference to the accompanying drawings, in which.

DETAILED DESCRIPTION OF THE INVENTION

Figure 1:
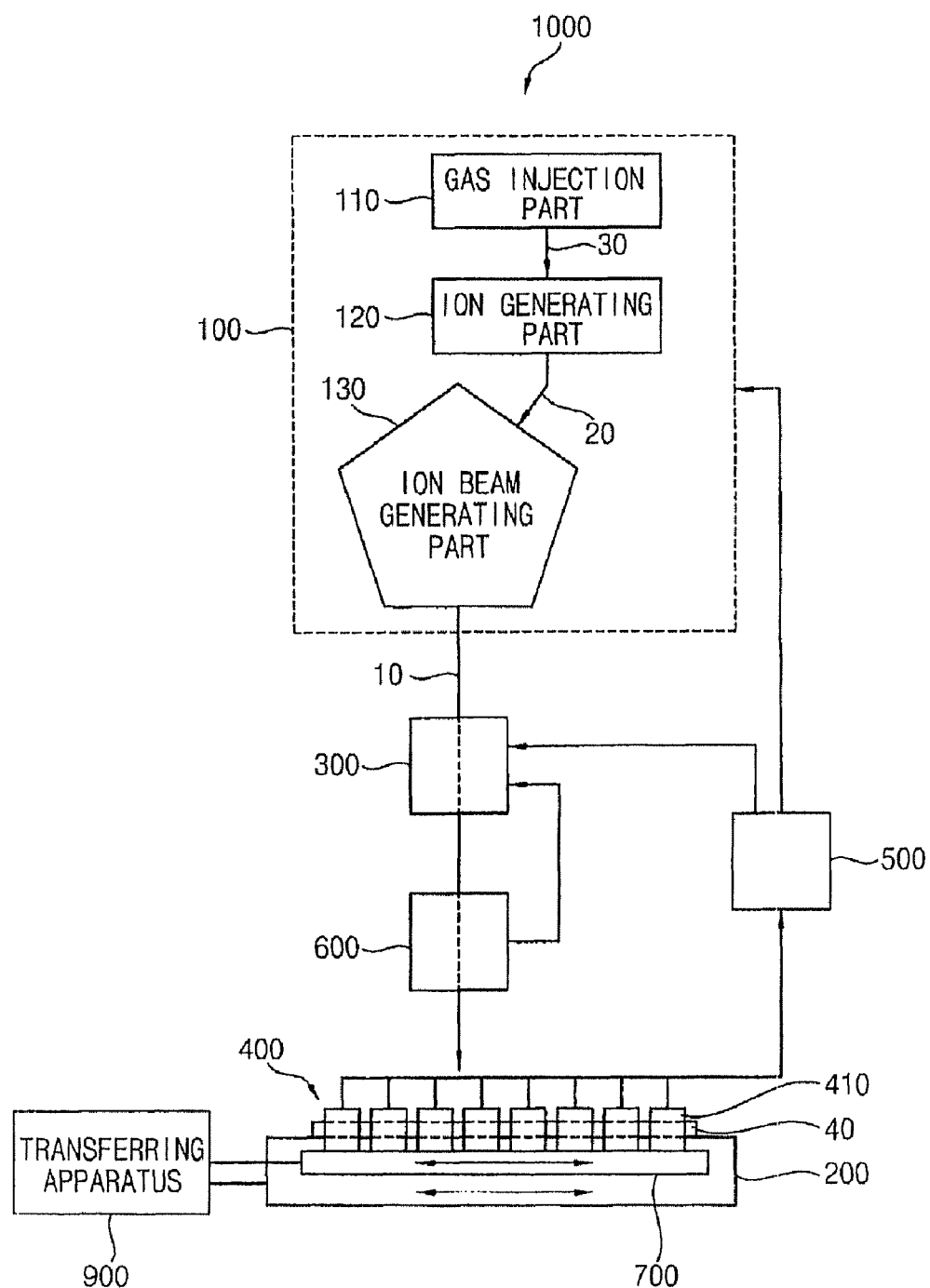
FIG. 1 is a conceptual plan view illustrating an ion implanting apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the exemplary embodiments of present invention will be explained in detail with reference to the accompanying drawings.

Figure 2:
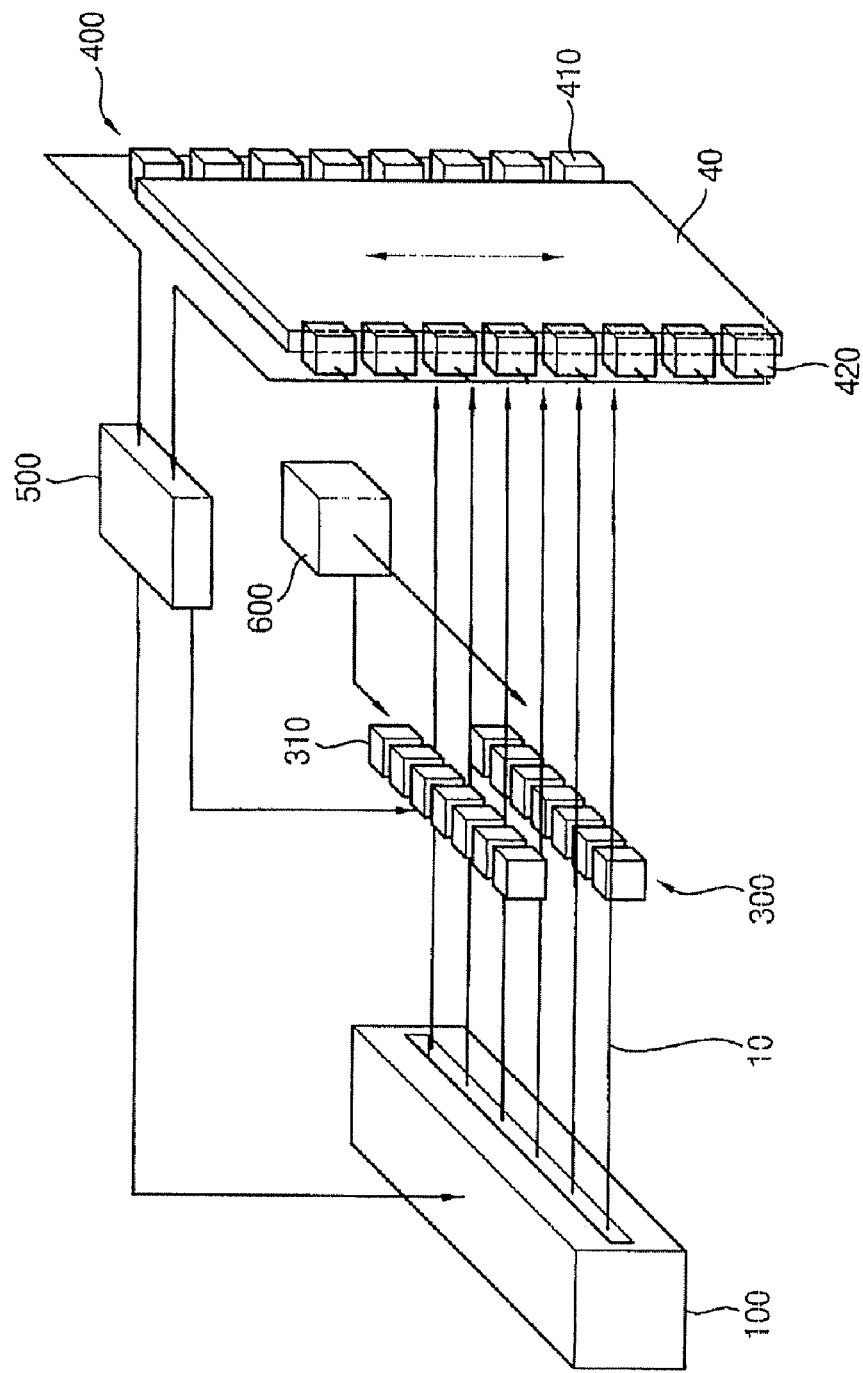
FIG. 2 is a conceptual perspective view illustrating the ion implanting apparatus in FIG. 1.
Figure 3:
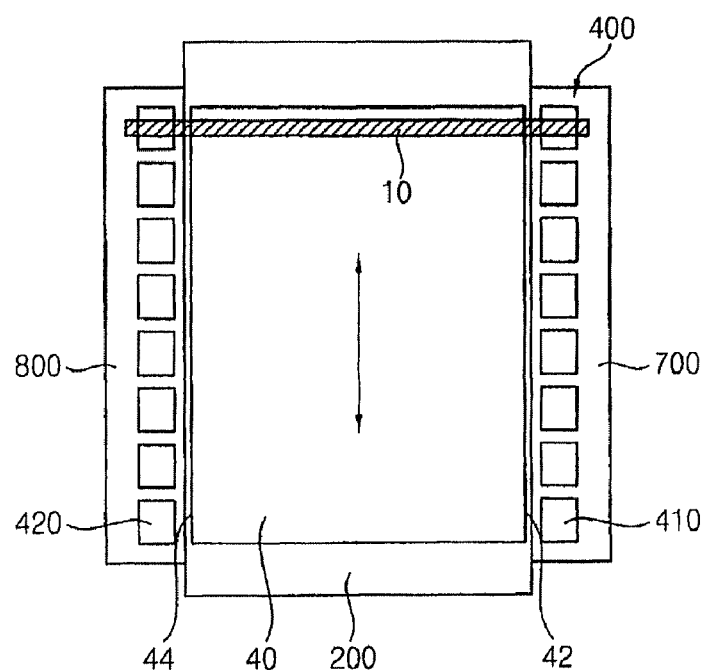
FIG. 3 is a plan view illustrating a substrate, and first and second measurement cells according to an exemplary embodiment of FIG. 2.

FIG. 1 is a conceptual plan view illustrating an ion implanting apparatus 1000 according to an exemplary embodiment of the present invention. FIG. 2 is a conceptual perspective view illustrating the ion implanting apparatus 1000 in FIG. 1. FIG. 3 is a plan view illustrating a substrate, and first and second measurement cells according to an exemplary embodiment of FIG. 2.

Referring to FIGS. 1, 2 and 3, the ion implanting apparatus 1000 according to the present exemplary embodiment includes an ion source part 100, a substrate holding part 200, a beam current adjusting part 300, a doping quantity measuring part 400 and an ion beam control part 500.

The ion source part 100 generates an ion beam 10. The ion beam 10 includes ions 20. For example, when a thin-film transistor (TFT) substrate (e.g., substrate 40) of a liquid crystal display (LCD) panel to display an image is implanted by the ion implanting apparatus 1000, the ions 20 may include boron (B), which is a Group 13 element or phosphorus (P), which is a Group 15 element.

In FIGS. 1 to 3, an implanted portion of the TFT substrate (e.g., substrate 40) includes amorphous silicon (a-Si) or poly-silicon (poly-Si), which is a Group 14 element. For example, the ions 20 may play the role of impurities in the TFT substrate, to enhance electrical characteristics of a-Si or poly-Si. The Group 13 element is implanted to form a positive charge, such as holes through a-Si or poly-Si, and the Group 15 element is implanted to generate a negative charge such as electrons through a-Si or poly-Si.

The ion source part 100 includes a gas injection part 110, an ion generating part 120 and an ion beam generating part 130. The gas injection part 110 injects a reactive gas 30 into the ion generating part 120. The reactive gas 30 includes borane (BH3) when the ions 20 include boron ions of the Group 13 element. Alternatively, the reactive gas 30 may include phosphine PH3 when the ions 20 include phosphorus P ions of the Group 15 element.

The gas injection part 110 may inject the reactive gas 30 via spraying of the reactive gas 30. The gas injection part 110 may include a plurality of slits for implementing the spray function. Alternatively, the gas injection part 110 may include a plurality of spray holes or spray nozzles. The spray holes or spray nozzles may be separated from each other by a constant distance.

The reactive gas 30 is injected from the gas injection part 110 into the ion generating part 120. The ion generating part 120 generates the ions 20 having various masses from the reactive gas.

For example, a metal electrode (not shown) may be formed inside of the ion generating part 120. The metal electrode may include tungsten (W). A high frequency power source is applied to the metal electrode. The high frequency power source reacts with the reactive gas 30 in the ion generating part 120 to generate plasma and the ions 20. In an exemplary embodiment, the ion generating part 120 is maintained in a vacuum state to stably generate the plasma.

The ion beam generating part 130 is connected to the ion generating part 120, and an angle between the ion beam generating part 130 and the ion generating part 120 is about 120°. A magnetic field that applies attractive and repulsive forces to the ions 20 is generated in the ion beam generation part 130. The ion beam generating part 130 utilizes the magnetic field to classify the ions 20 generated from the ion generating part 120 based on the mass of the ions 20.

For example, the ion beam generating part 130 may control the intensity of the magnetic field, so that the ion beam 10 having the ions 20 of a predetermined mass is generated. When a cross-sectional surface of the ion beam 10 is longitudinally formed along a direction, the cross-sectional surface of the ion beam 10 may have a predetermined area.

The ions may be classified using the magnetic field as follows. The ions 20 heavier than a predetermined mass M may be difficult to deflect by as much as the angle between the ion beam generating part 130 and the ion generating part 120, so that the heavy ions 20 may be deviated from the path of the ion beam 10. On the contrary, the ions 20 lighter than the predetermined mass M may be trapped by the magnetic field, so that the light ions 20 may not be deviated from the path.

In an exemplary embodiment, the ion beam 10 is irradiated in a direction substantially parallel with the ground surface, and that is substantially perpendicular to a gravitational direction. Thus, impurities included in the ion beam 10 are affected by gravity, so that the impurities are prevented from being accumulated on the doping quantity measuring part 400. In this embodiment, the life of the doping quantity measuring part 400 may be extended, as the accumulation of impurities thereon is prevented. In an alternative exemplary embodiment, the ion beam 10 may be irradiated in a direction that is substantially perpendicular to the ground surface.

The substrate holding part 200 holds the substrate 40. The ion beam 10 is continuously irradiated onto the substrate 40. The ion beam 10 may be irradiated along a width of a planar surface of the substrate 40 and may have a scanning direction that traverses the planar surface in a lengthwise direction thereof. Those ions 20 having substantially the same mass as the ion beam 10 are implanted into the substrate 40. The substrate 40 may include the TFT substrate as mentioned above.

The substrate holding part 200 determines a position of the substrate 40. For example, when the ion beam 10 is irradiated substantially parallel with the ground surface, the substrate holding part 200 holds the substrate 40 in a direction substantially perpendicular to the ground surface. Alternatively, when the ion beam 10 is irradiated substantially perpendicular to the ground surface, the substrate holding part 200 holds the substrate 40 substantially parallel with the ground surface.

The substrate holding part 200 may hold the substrate 40 via a vacuum absorption method. Alternatively, the substrate holding part 200 may include an additional holding clamp holding the side of the substrate 40. In addition, the substrate holding part 200 may hold the substrate via a sliding method.

The beam current adjusting part 300 is disposed between the ion source part 100 and the substrate holding part 200. The beam current adjusting part 300 adjusts a beam current according to a position of the ion beam 10. The position of the ion beam 10 refers to a position substantially perpendicular to the irradiation direction of the ion beam 10.

The beam current adjusting part 300 includes a plurality of magnetic poles 310. The magnetic poles 310 are formed to enclose the ion beam 10 along a perpendicular direction to the irradiation direction of the ion beam 10. A magnetic force is applied to the magnetic poles 310. For example, according to the intensity of the magnetic force, the magnetic poles 310 may adjust the beam current according to the position of the ion beam 10.

In an exemplary embodiment, the ion beam 10 has substantially the same beam current regardless of the position of the ion beam 10, so that the ions 20 are uniformly implanted into the substrate 40. However, the beam current adjusting part 300 merely controls the beam current according to the position of the ion beam 10, and may not measure the beam current. Thus, the ion implanting apparatus 1000 may further include a beam scanning part 600.

The beam scanning part 600 is disposed between the beam current adjusting part 300 and the substrate holding part 200. The beam scanning part 600 scans the ion beam 10 to measure the beam current according the position of the ion beam 10, before the ions 20 are implanted into the substrate 40.

The beam scanning part 600 analyzes the measured beam current and outputs data to increase the uniformity of the beam current according to the position of the ion beam 10, and then the data is fed back to the beam current adjusting part 300. The beam current adjusting part 300 changes the intensity of the magnetic force applied to the magnetic poles 310 using the data, so that the ion beam 10 is uniformly irradiated regardless of the position of the ion beam 10. Thus, the ion beam 10 is uniformly irradiated onto the substrate, using the beam scanning part 600 and the beam current adjusting part 300.

The doping quantity measuring part 400 is disposed on substantially the same surface as the substrate 40. The doping quantity measuring part 400 measures an ion doping quantity implanted into the substrate 40 in real time. The doping quantity measuring part 400 includes first measurement cells 410 and second measurement cells 420.

The first measurement cells 410 are disposed along a first side 42 of the substrate 40 in a direction that is substantially parallel with the scanning direction of the ion beam 10. When the scanning direction is substantially parallel with relatively longer sides of the substrate 40, the first side 42 may be one of the relatively longer sides of the substrate 40.

The first measurement cells 410 are aligned in a linear shape. The first measurement cells 410 are spaced apart from each other by a constant distance. Alternatively, the first measurement cells 410 may be adjacent to each other. In addition, the first measurement cells 410 may be integrally formed with each other and may be extended along the relatively longer sides of the substrate 40.

The second measurement cells 420 are disposed along a second side 44 opposite to the first side 42 of the substrate 40. The second side 44 may be one of the relatively longer sides of the substrate 40 different from the first side 42. The second measurement cells 420 are substantially same as the first measurement cells 410 except that the second measurement cells 420 are disposed opposite to the first measurement cells 410, and thus further repetitive descriptions may be omitted. The first and second measurement cells 410 and 420 are substantially symmetric with respect to a central axis of the substrate 40 substantially parallel with the scanning direction.

The ion beam 10 scans the substrate 40 and is irradiated into the first and second measurement cells 410 and 420. Thus, the ions 20 of the ion beam 10 are implanted into the substrate 40, and at the same time, the quantity of the irradiated ions 20 is measured in the first and second measurement cells 410 and 420.

In FIGS. 1 to 3, the first and second measurement cells 410 and 420 are not spaced apart from the substrate 40, and thus the measured ion doping quantity may not be assumed to be an exact value of the doping quantity. However, the ion beam 10 is adjusted to have substantially the same ion doping quantity regardless of the position of the ion beam 10 in the beam scanning part 600 and the beam current adjusting part 300, and thus the ion doping quantity measured at the first and second measurement cells 410 and 420 may be substantially the same as the exact value of the doping quantity of the substrate.

The ion beam control part 500 is connected to the doping quantity measuring part 400. For example, the ion beam control part 500 may be connected to the first and second measurement cells 410 and 420. Alternatively, the first measurement cells 410 may be connected each other to form a first group, and the second measurement cells 420 may be connected to each other to form a second group, and then, the ion beam control part 500 may be connected to the first and second groups.

The ion beam control part 500 controls the ion source part 100 and the beam current adjusting part 300, based on the doping quantity measured from the first and second measurement cells 410 and 420. For example, the ion beam control part 500 controls the ion beam 10 in real time. When the doping quantity implanted into the substrate 40 is different from a predetermined reference or the beam current according to the position of the ion beam 10 is different, the ion beam control part 500 controls the ion beam 10 in real time, so that the ions are uniformly implanted into the substrate 40 at the doping quantity substantially same as the predetermined reference.

Accordingly, the doping quantity measuring part 400 measures the ion doping quantity included in the ion beam 10 on a surface substantially the same as the substrate 40 in real time, and the ion beam control part 500 controls the ion source part 100 and the beam current adjusting part 300 based on the doping quantity. Thus, defects caused by irregularly implanting the ions 20 of the ion beam 10 on the substrate 40 may be prevented.

The defects in the implanting may be caused when the doping quantity is not uniform or the doping quantity is different from the predetermined reference. When the defects in the implanting are caused, the electrical characteristics of the substrate 40 may be deteriorated. When the substrate 40 is the TFT substrate, the defects in the implanting deteriorate the display quality of an LCD apparatus including the TFT substrate.

In addition, when the defects of the substrate 40 relating to the electrical characteristics are caused, the ion implanting apparatus 1000 may trace defect positions via the doping quantity measured at the doping quantity measuring part 400. In FIGS. 1 to 3, the substrate 40 having the defect positions may be recycled to be reused.

The ion implanting apparatus 1000 may further include the first and second measurement cell holding parts 700 and 800, and a transferring apparatus 900. The first and second measurement cell holding parts 700 and 800 respectively hold the first and second measurement cells 410 and 420. The transferring apparatus 900 transfers the substrate holding part 200 and the first and second measurement cells 410 and 420 at the same time.

Figure 4:
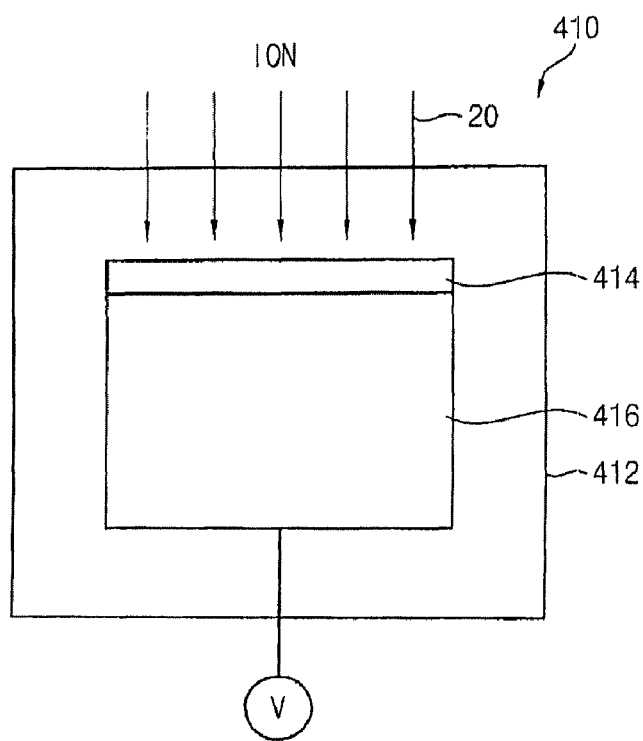
FIG. 4 is a side view illustrating one of the first and second measurement cells in FIG. 2.

FIG. 4 is a side view illustrating one of the first and second measurement cells 410 and 420 in FIG. 2. In the present exemplary embodiment, the first and second measurement cells 410 and 420 respectively have substantially the same structure, and thus, the first measurement cell 410 will be described.

Referring to FIGS. 2 and 4, the first measurement cell 410 includes an exterior portion 412, an ion sensing portion 414 and a voltage generating portion 416.

The exterior portion 412 maintains an external shape of the first measurement cell 410, and receives the ion sensing portion 414 and the voltage generating portion 416. A surface of the exterior portion 412 is exposed. Thus, the ions 20 of the ion beam 10 are allowed to flow inside of the exterior portion 412 through the surface of the exterior portion 412. In FIGS. 2 and 4, the exterior portion 412 may include an opening portion or a plurality of slits formed through the surface of the exterior portion 412.

The ion sensing portion 414 is disposed corresponding to the exposed surface of the exterior portion 412. The ion sensing portion 414 senses the ion doping quantity, for example, an ion quantity that flows into the ion sensing portion 414. The ion sensing portion 414 may include a metal absorbing or reacting with the ions 20.

The voltage generating portion 416 is connected to the ion sensing portion 414. The voltage generating portion 416 generates different voltages V according to the ion quantity. For example, the voltage V may be a direct current (DC) voltage. Alternatively, the voltage V may be an alternating current (AC) voltage. The voltage V may linearly increase or linearly decrease, according as the ion quantity increases.

Accordingly, the first measurement cell 410 generates different voltages V according to the ion quantity that flows into the first measurement cell 410, and thus the ion quantity may be numerically verified.

Figure 5:
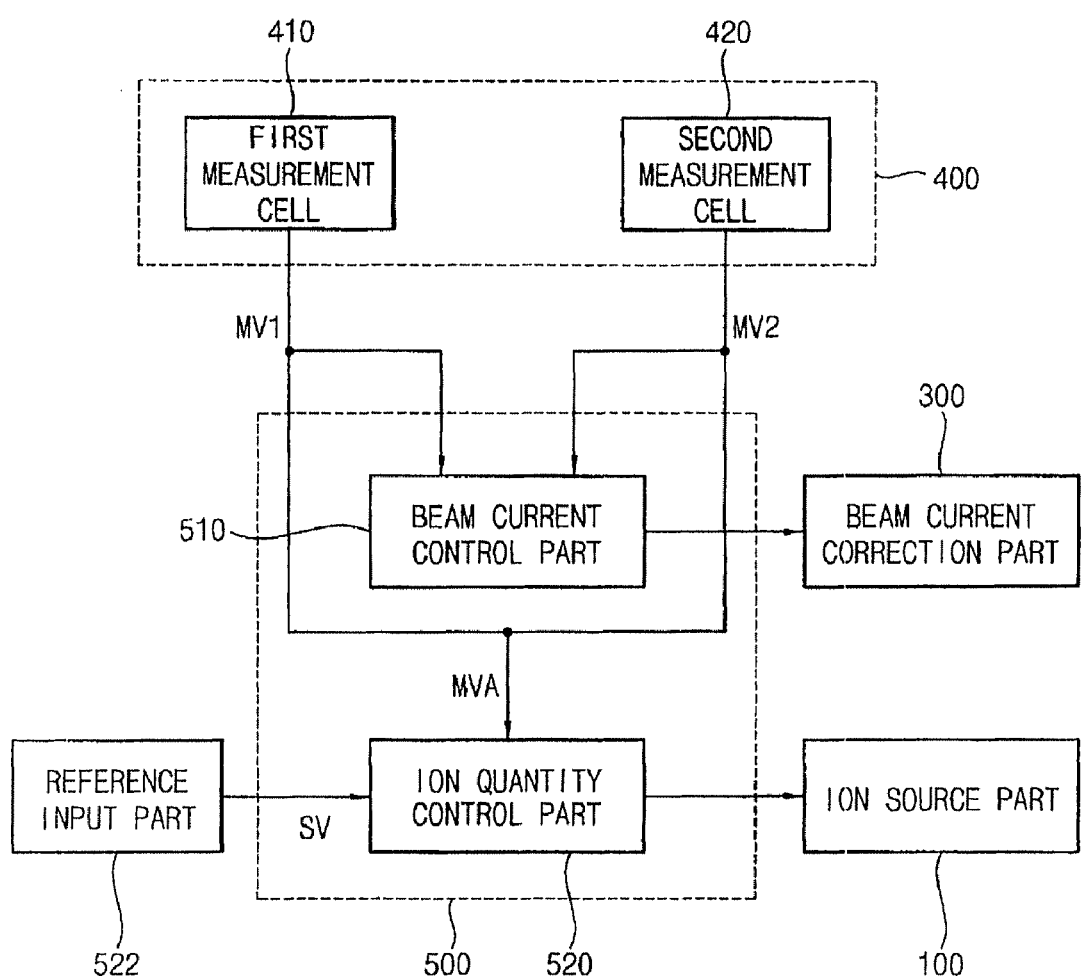
FIG. 5 is a block diagram illustrating functions of the ion beam control part in FIG. 2.

FIG. 5 is a block diagram illustrating functions of the ion beam control part in FIG. 2.

Referring to FIGS. 1, 2 and 5, the first measurement cell 410 of the doping quantity measuring part 400 outputs a first measured value MV1, and the second measurement cell 420 outputs a second measured value MV2. The first and second measured values MV1 and MV2 may be described based on the explanation mentioned in FIG. 4.

The first and second measured values MV1 and MV2 are measured at substantially both ends of the ion beam 10. The first and second measurement cells 410 and 420 are respectively disposed at the both ends of the ion beam 10 between which the substrate 40 is disposed.

The ion beam control part 500 includes a beam current control part 510 and an ion quantity control part 520. The beam current control part 510 feeds a first difference between the first and second measured values MV1 and MV2 according to substantially the same ion beam 10 back to the beam current adjusting part 300.

When the first measured value MV1 is higher than the second measured value MV2, the beam current adjusting part 300 applies a relatively lower magnetic force to the magnetic poles 310 corresponding to the first measurement cell 410. In addition, the beam current adjusting part 300 applies a relatively higher magnetic force to the magnetic poles 310 corresponding to the second measurement cell 420.

In addition, the ion quantity of the ion beam 10 according to the position may be linearly increased with respect to the magnetic force, so that the magnetic force that is linearly increased with respect to the magnetic force applied to the magnetic poles 310 corresponding to the first and second measurement cells 410 and 420 may be applied to the magnetic poles 310 corresponding to the substrate 40. Thus, the uniformity of the beam current according to the position of the ion beam 10 may be increased.

Furthermore, when the first measured value MV1 is lower than the second measured value MV2, the beam current adjusting part 300 applies the relatively higher magnetic force to the magnetic poles 310 corresponding to the first measurement cell 410. In addition, the beam current adjusting part 300 applies the relatively lower magnetic force to the magnetic poles 310 corresponding to the second measurement cell 420.

When the first difference is substantially zero, the ion beam 10 is uniformly irradiated, so that the beam current control part 510 may not feed back to the beam current adjusting part 300.

When the first and second measured values MV1 and MV2 are outputted in inverse proportion to each other, the magnetic force may be applied opposite to the above-mentioned way. For example, when the first measured value MV1 is higher than the second measured value MV2, the beam current adjusting part 300 applies the relatively higher magnetic force to the magnetic poles corresponding to the second measurement cell 420.

The ion quantity control part 420 feeds a second difference back to the ion source part 100. The second difference is a difference between an average MVA of the first and second measured values MV1 and MV2 according to substantially the same ion beam 10 and a predetermined reference SV. In FIGS. 2 and 5, a reference input part 522 may be connected to the ion quantity control part 420 to input the predetermined reference SV.

When the average MVA is greater than the predetermined reference SV by the second difference, the reactive gas 30 decreased by substantially the same amount as the second difference is injected into the ion generating part 120 from the gas injection part 110. The ions 20 of the ion beam 10 that are implanted into the substrate 40 number more than the predetermined reference SV.

On the contrary, when the average MVA is smaller than the predetermined reference SV by the second difference, the reactive gas 30 increased by substantially the same amount as the second difference is injected into the ion generating part 120 from the gas injection part 110. The first and second measured values MV1 and MV2 may be assumed to be substantially proportional to the ion quantity. However, when the first and second measured values MV1 and MV2 are assumed to be substantially inversely proportional to the ion quantity, the reactive gas 30 may be injected substantially inverse to the way mentioned above.

When the second difference is substantially zero, the ions 20 are implanted with substantially the same as the predetermined reference SV, so that the ion quantity control part 420 may not feed back to the ion source part 100.

The beam current control part 510 and the ion quantity control part 420 may be connected to each other. For example, the uniformity of the ion beam 10 may be increased according to the position, and then the beam current control part 510 may control the quantity of the ions 20.

Accordingly, the ion beam control part 500 controls the ion beam 10 in real time, based on the first and the second measured values MV1 and MV2 respectively measured by the first and second measurement cells 410 and 420, so that the ions 20 having the predetermined reference SV may be uniformly implanted into the substrate 40.

Figure 6:
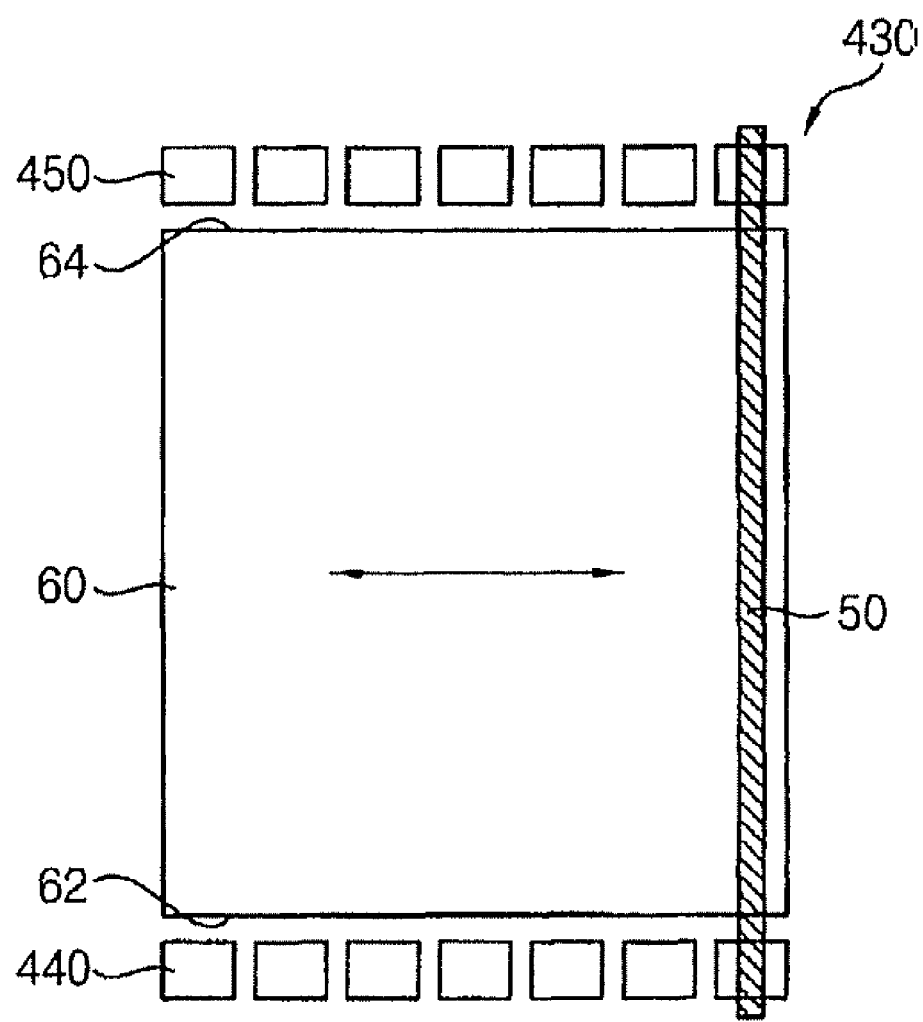
FIG. 6 is a plan view illustrating a substrate, and first and second measurement cells according to another exemplary embodiment of FIG. 2.

FIG. 6 is a plan view illustrating a substrate 60, and first and second measurement cells 440 and 450 of a doping quantity measurement part 430 according to another exemplary embodiment of FIG. 2.

The first and second measurement cells 440 and 450 according to the present exemplary embodiment are substantially the same as the exemplary embodiment in FIGS. 4 and 5 except for positions of the first and second measurement cells, and thus any further repetitive explanation concerning the above elements will be omitted.

Referring to FIGS. 2 and 6, the ion beam 50 is irradiated onto the substrate 60 in a direction substantially parallel with relatively shorter sides of the substrate 60. For example, a cross-sectional area of the ion beam 50 at a predetermined position is formed along relatively longer sides of the substrate 60.

The first measurement cells 440 of the doping quantity measuring part 430 are arranged in a linear shape along a third side 62 of the relatively shorter sides of the substrate 60. In addition, the second measurement cells 450 are arranged in a linear shape along a fourth side 64 opposite to the third side 62.

Thus, an irradiation section of the ion beam 50 is shorter than that in the exemplary embodiment of FIG. 3, so that an irradiation time of the ion beam 50 may be decreased.

Figure 7:
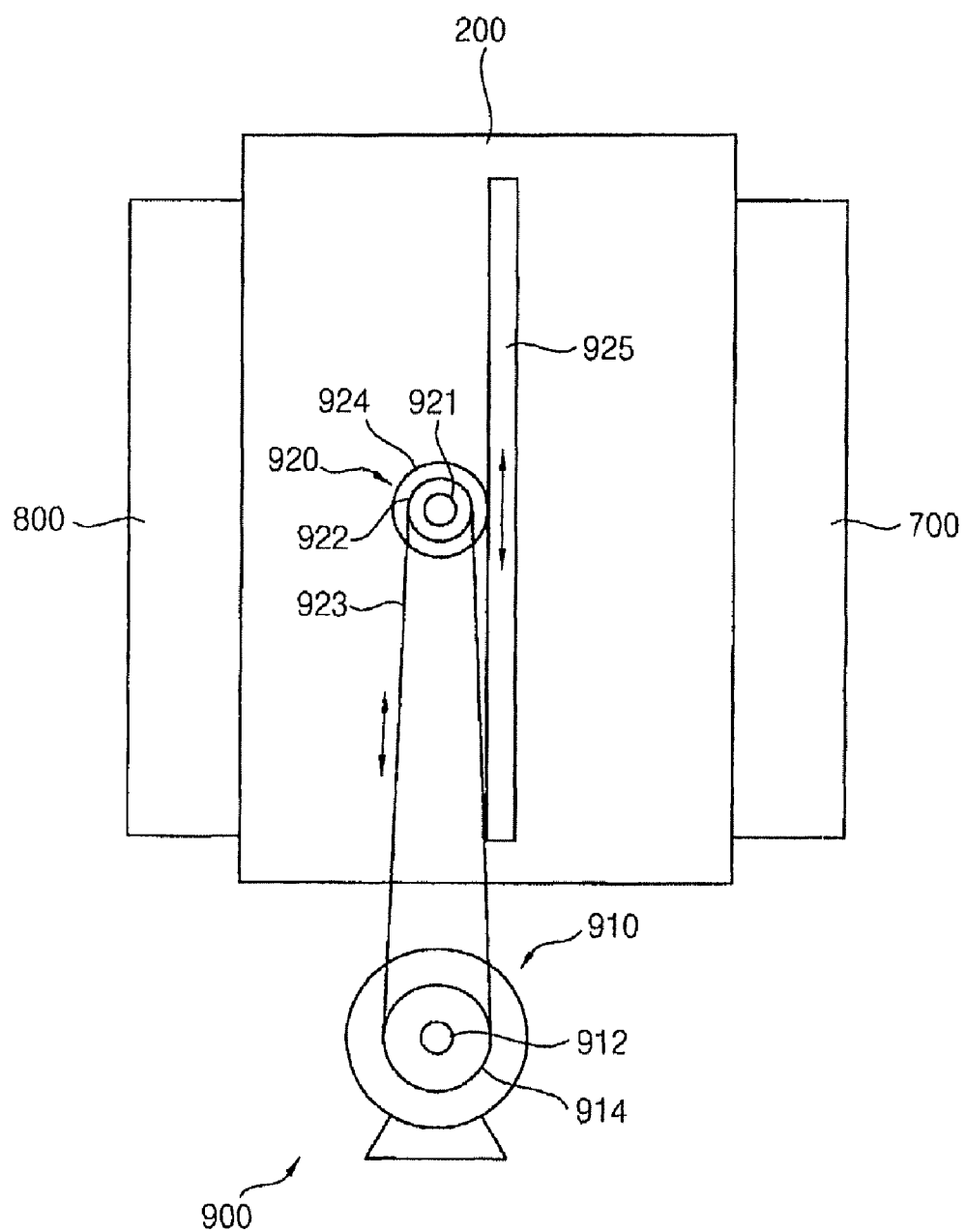
FIG. 7 is a plan view illustrating a transferring apparatus and first and second measurement cell holding parts according to an exemplary embodiment of FIG. 1.

FIG. 7 is a plan view illustrating a transferring apparatus 900 and first and second measurement cell holding parts 700 and 800 according to an exemplary embodiment of FIG. 1.

Referring to FIGS. 1 and 7, the first and second measurement cell holding parts 700 and 800 are fixed to the substrate holding part 200, so that the transferring apparatus 900 may transfer the first and second measurement cell holding parts 700 and 800 with the substrate holding part 200 at the same time.

The transferring apparatus 900 includes a driving part 910 and a power transmitting part 920. The driving part 910 includes a driving motor making a circular movement using an external power source. The driving motor may include a servo motor that may be precisely controlled. The driving part 910 includes a driving axle 912, and a first pulley 914 fixed to the driving axle 912, and transmits the circular movement.

The power transmitting part 920 includes a rotation axle 921, a second pulley 922 and a belt 923. The rotation axle 921 is fixed to an external frame to make the circular movement. The rotation axle 921 is disposed on a rear surface of the substrate holding part 200.

The second pulley 922 is fixed to the rotation axle 921, to make the circular movement with the rotation axle 921 at the same time. The belt 923 is connected to the first and second pulleys 914 and 922, to directly apply the circular movement of the driving motor to the rotation axle 921. The belt 923 may include a V-belt. In FIGS. 1 and 7, the first and second pulleys 914 and 922 may include a V-pulley. Alternatively, the belt 923 may include a timing belt to transmit the circular movement more accurately. In addition, the first and second pulleys 914 and 922 may include the timing belt.

The belt 923 may be substituted for a chain, and the first and second pulleys 914 and 922 may be substituted for a sprocket, to transmit the circular movement more accurately.

The power transmitting part 920 may further include a first gear 924 and a second gear 925. The first gear 924 is fixed to the rotation axle 921. The second gear 925 is fixed to the rear surface of the substrate holding part 200 to convert the circular movement of the first gear 924 into a straight movement. For example, the first gear 924 may include a spur gear and the second gear 925 may include a rack gear.

Accordingly, the first and second measurement cell holding parts 700 and 800 are fixed to the substrate holding part 200, and the transferring apparatus 900 moves the substrate holding part 200 using one driving part 910 and one power transmitting part 920, so that driving mechanism of the transferring apparatus 900 may be simplified.

Figure 8:
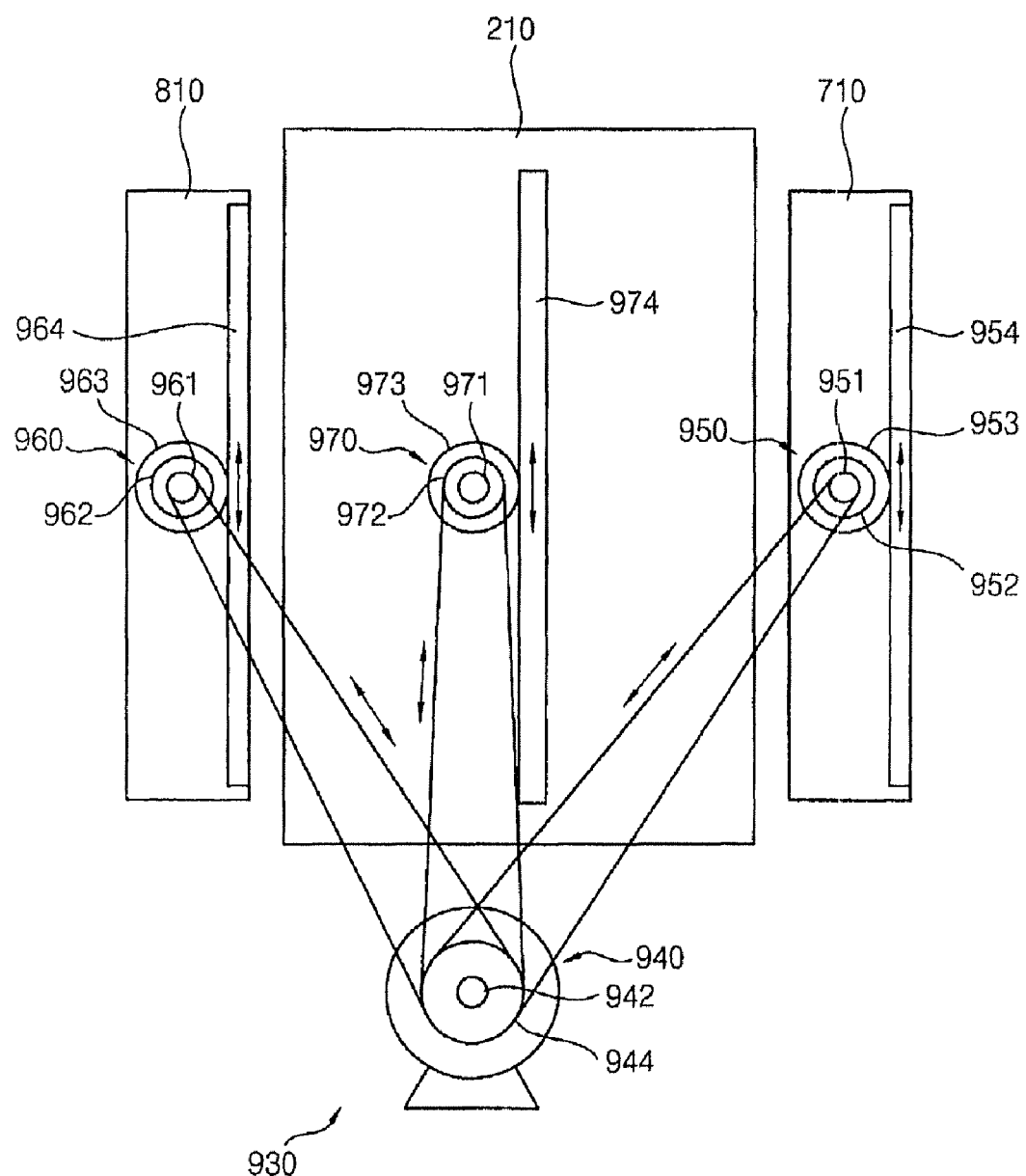
FIG. 8 is a plan view illustrating a transferring apparatus and first and second measurement cell holding parts according to another exemplary embodiment of FIG. 1.

FIG. 8 is a plan view illustrating a transferring apparatus 930 and first and second measurement cell holding parts 710 and 810 according to another exemplary embodiment of FIG. 1.

Referring to FIGS. 1 and 8, the first and second measurement cell holding parts 710 and 810 are separated from the substrate holding part 210, and are independently controlled.

The transferring apparatus 930 includes a driving part 940, and first, second and third power transmitting parts 950, 960 and 970. The driving part 940 includes one driving motor making the circular movement. The first, second and third power transmitting parts 950, 960 and 970 according to the present exemplary embodiment are substantially same as the power transmitting part 920 in FIG. 7 except that the first, second and third power transmitting parts 950, 960 and 970 transmit a different object from the power transmitting part 920 in FIG. 7, and thus any further repetitive explanation concerning the above elements will be omitted.

The first power transmitting part 950 transmits power to the first measurement cell holding part 710. The second power transmitting part 960 transmits the power to the second measurement cell holding part 810. The third power transmitting part 970 transmits the power to the substrate holding part 210. The first, second and third power transmitting parts 950, 960 and 970 have a power transmitting mechanism for transmitting the first and second measurement cell holding parts 710 and 810 and the substrate holding part 210 with substantially the same velocity at the same time.

For example, one first pulley 944 is fixed to a driving axle 942 of the driving part 940. The first power transmitting part 950 may further include a first rotation axis 951 and a second pulley 952. The second power transmitting part 960 may further include a second rotation axis 961 and a third pulley 962. The third power transmitting part 970 may further include a third rotation axis 971 and a fourth pulley 972. The first, second and third axles 951, 961 and 971 are respectively fixed to external frames corresponding to the first measurement cell holding part 710, the second measurement cell holding part 810 and the substrate holding part 210. The second, third and fourth pulleys 952, 962 and 972 having substantially the same size are respectively fixed to the first, second and third rotation axles 951, 961 and 971 to be connected to the first pulley 944 by a belt.

In addition, the first power transmitting part 950 may further include a first spur gear 953 and a first rack gear 954. The second power transmitting part 960 may further include a second spur gear 963 and a second rack gear 964. The third power transmitting part 970 may further include a third spur gear 973 and a third rack gear 974. The first, second and third spur gears 953, 963 and 973 having substantially the same size are respectively fixed to the first, second and third rotation axles 951, 961 and 971. The first, second and third rack gears 954, 964 and 974 having substantially the same size are respectively fixed to the first measurement cell holding part 710, the second measurement cell holding part 810 and the substrate holding part 210.

Accordingly, the first and second measurement cell holding parts 710 and 810 are separated from the substrate holding part 210, and the first and second measurement cell holding parts 710 and 810 and the substrate holding part 210 are simultaneously moved with substantially the same velocity by the transferring apparatus 930, so that the first and second measurement cell holding parts 710 and 810 may be easily maintained.

Figure 9:
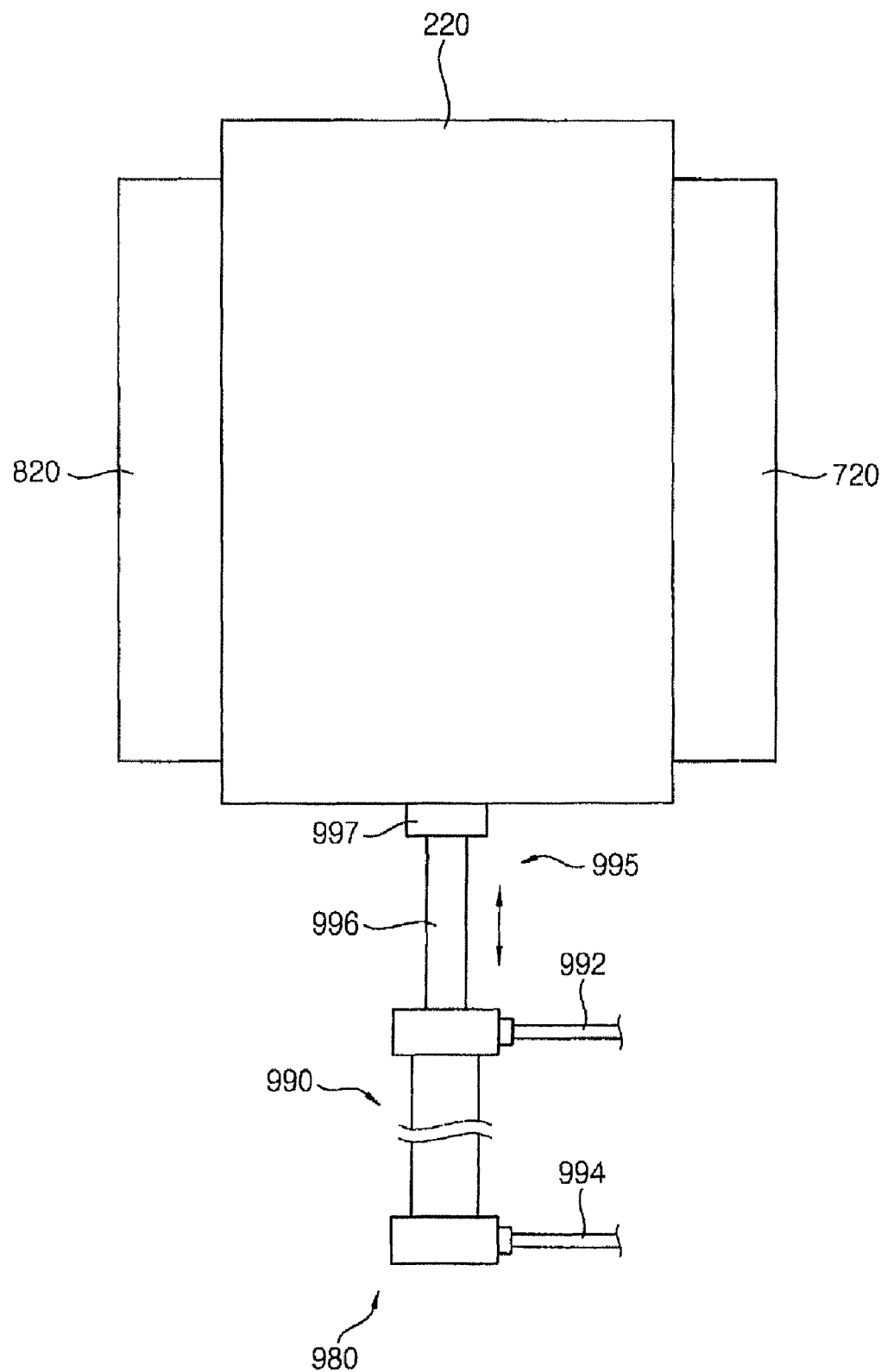
FIG. 9 is a plan view illustrating a transferring apparatus and first and second measurement cell holding parts according to still another exemplary embodiment of FIG. 1.

FIG. 9 is a plan view illustrating a transferring apparatus and first and second measurement cell holding parts according to still another exemplary embodiment of FIG. 1.

The transferring apparatus 980 according to the present exemplary embodiment is substantially same as the transferring apparatus 900 in FIG. 7 except that the transferring apparatus 980 includes a cylinder, and thus any further repetitive explanation concerning the above elements will be omitted.

Referring to FIGS. 1 and 9, the first and second measurement cell holding parts 720 and 820 are fixed to the substrate holding part 220, and the substrate holding part 220 is transferred by the transferring apparatus 980 having a driving part 990 that includes a cylinder.

The driving part 990 makes a straight movement. The straight movement of the driving part 990 is directly transmitted to the substrate holding part 220 by a power transmitting part 995. First and second applying lines 992 and 994 are connected to both ends of the driving part 990, to apply a pressure from an external source to the driving part 990.

One of air and oil may be applied through the first and second applying lines 992 and 994. The driving part 990 is referred to as an air pressure type when the air is applied, and the driving part 990 is referred to as an oil pressure type when the oil is applied. The air pressure type driving part may be useful when a relatively lower force is applied to the driving part 990, and the oil pressure type driving part may be useful when a relatively higher force is applied to the driving part 990.

The power transmitting part 995 includes a cylinder rod 996 and a holding part 997. The cylinder rod 996 makes a straight reciprocating movement through the driving part 990. The holding part 997 connects the cylinder rod 996 with the substrate holding part 220.

Alternatively, as illustrated in FIG. 8, when the first and second measurement cell holding parts 720 and 820 are separated from the substrate holding part 220, the power transmitting part 995 may include three parts to obtain substantially the same effect.

Thus, the transferring apparatus 980 includes the driving part 990 having the cylinder that makes the straight movement by itself, to be easily driven without changing a driving direction.

Figure 10:
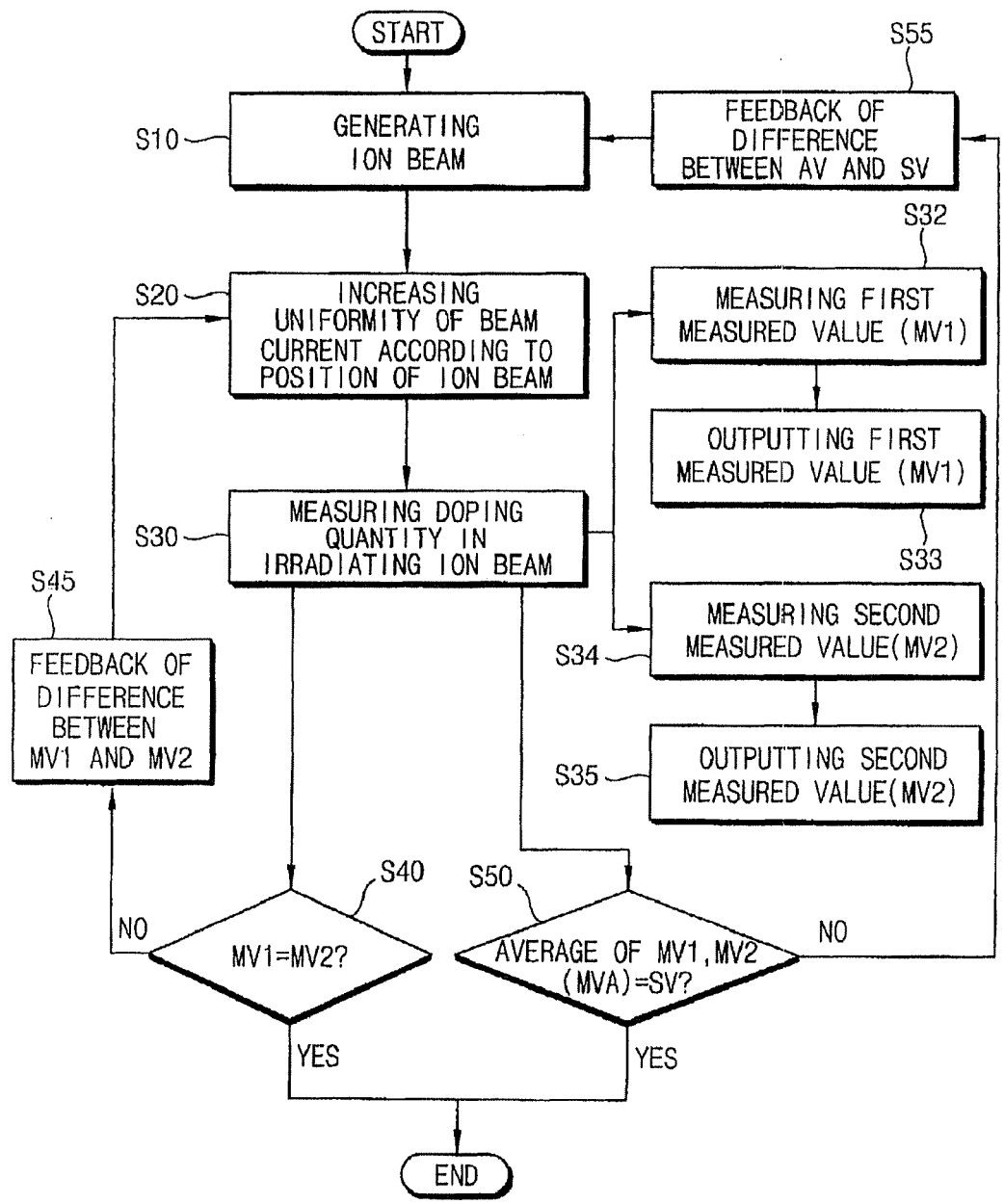
FIG. 10 is a block diagram illustrating a method for implanting ions according to an exemplary embodiment of the present invention.

FIG. 10 is a block diagram illustrating a method for implanting ions according to an exemplary embodiment of the present invention.

Referring to FIGS. 1 and 10, according to the present exemplary embodiment, the ion beam 10 is generated from the reactive gas 30 (step S10).

The beam current according to the position of the ion beam 10 is measured and adjusted, to increase the uniformity of the ion beam (step S20). Then, the ion doping quantity is measured in real time during irradiating of the ion beam 10 to the substrate 40 (step S30).

For example, the ion doping quantity is determined (step S20) by measuring a first measured value MV1 using the first measurement cells 410 at the first side 42 of the substrate 40 substantially parallel with the scanning direction of the ion beam 10 (step S32) and outputting the first measured value MV1 (step S33), and measuring a second measured value MV2 using the second measurement cells 420 at the second side 44 opposite to the first side 42 of the substrate 40 (step S34) and outputting the second measured value MV2 (step S35).

The beam current of the ion beam 10 is controlled based on the measured doping quantity (step S40). In the present step S40, the beam current of the ion beam 10 is controlled based on the difference between the first and second measured values MV1 and MV2 in real time, so that the uniformity of the ion beam 10 is increased.

When the first and second measured values MV1 and MV2 are different from each other, the step is fed back to the step S20 increasing the uniformity of the beam current of the ion beam 10 (step S45). For example, magnetic forces that are substantially in inverse proportion to the first and second measured values MV1 and MV2 are applied to the ion beam 10.

For example, a lower magnetic force is applied to the ion beam 10 corresponding to the measurement cell having a higher value of the first and second measurement values MV1 and MV2. A higher magnetic force is applied to the ion beam 10 corresponding to the measurement cell having a lower value of the first and second measurement values MV1 and MV2. In addition, the magnetic force straightly connected to the magnetic force applied to the higher value and the lower value is sequentially applied to the ion beam 10 corresponding to a distance between the first and second measurement cells 410 and 420.

When the first and the second measured values MV1 and MV2 are substantially the same, the feedback step (S45) is not necessary.

The ion quantity of the ion beam 10 is controlled in real time, based on the difference between the average MVA of the first and second measured values MV1 and MV2 according to substantially the same ion beam 10 and the predetermined reference SV (S50). At the same time, the beam current is controlled (step S40) and the ion quantity of the ion beam 10 is controlled (step S50).

When the average MVA is different from the predetermined reference SV, the step S50 is fed back to the step S10 generating the ion beam 10 (step S55). For example, the ion quantity of the ion beam 10 is controlled, so that the average MVA reaches the predetermined reference SV.

For example, when the average MVA is higher than the predetermined reference SV, the reactive gas 30 generating the ion beam 10 is decreased so that the amount of the ions is decreased. When the average MVA is lower than the predetermined reference SV, the reactive gas 30 generating the ion beam 10 is increased to generate more ions.

However, when the average MVA is substantially same as the predetermined reference SV, the step S55 of feeding back to the step S10 generating the ion beam 10 is not necessary.

Accordingly, when the ions 20 of the ion beam 10 are implanted into the substrate 40, the beam current and the ion quantity of the ion beam 10 are controlled in real time, the ions 20 having the predetermined reference SV are uniformly implanted into the substrate 40 regardless of the position.

According to the present invention, the doping quantity measuring part measures the ions implanted into the substrate on substantially the same surface as the substrate in real time. Also, the doping quantity measuring part further includes the ion beam control part controlling the ion source part and the beam current adjusting part based on the doping quantity. Thus, the beam current of the ion beam and the ion quantity may be controlled in real time while the ions of the ion beam are implanted into the substrate. Thus, defects may be prevented when ions are implanted into a substrate. In addition, the uniformity of the ion beam may be increased.

Having described the exemplary embodiments of the present invention and its advantage, it is noted that various changes, substitutions and alterations can be made herein without departing from the spirit and scope of the invention as defined by appended claims.

What is claimed is:

1. An ion implanting apparatus comprising:
an ion source part generating an ion beam;
a substrate holding part holding a substrate, the ion beam irradiated onto the substrate so that ions are implanted into the substrate;
a beam current adjusting part disposed between the ion source part and the substrate holding part, to adjust a beam current according to a position of the ion beam;
a doping quantity measuring part disposed on substantially the same surface as the substrate, to measure ion doping quantity in real time; and
an ion beam control part connected to the doping quantity measuring part, to control the ion source part and the beam current adjusting part according to the ion doping quantity,
wherein the doping quantity measuring part comprises:
a plurality of first measurement cells disposed along a first side of the substrate substantially parallel with a scanning direction of the ion beam; and
a plurality of second measurement cells disposed along a second side of the substrate opposite to the first side of the substrate.

2. The ion implanting apparatus of claim 1, wherein the first and second measurement cells are substantially symmetric with respect to a central axis of the substrate substantially parallel with the scanning direction.

3. The ion implanting apparatus of claim 2, wherein the first and second measurement cells respectively output first and second measured values that are dependent on the ion doping quantity.

4. The ion implanting apparatus of claim 3, wherein the first and second measured values are outputted as voltage.

5. The ion implanting apparatus of claim 3, wherein the ion beam control part comprises a beam current control part through which a first difference between the first and second measured values corresponding to substantially same ion beam is fed back to the beam current adjusting part.

6. The ion implanting apparatus of claim 5, wherein the beam current adjusting part comprises a plurality of magnetic poles enclosing the ion beam and applying a magnetic force differently based on the first difference to enhance uniformity of the beam current according to the position of the ion beam.

7. The ion implanting apparatus of claim 5, wherein the ion beam control part further comprises an ion quantity control part through which a second difference between an average of the first and second measured values corresponding to substantially same ion beam and a predetermined reference is fed back to the ion source part.

8. The ion implanting apparatus of claim 7, wherein the ion source part comprises:
a gas injection part differently injecting a reactive gas, based on the second difference;
an ion generating part generating the ions from the reactive gas; and
an ion beam generating part classifying the ions based on a mass to generate the ion beam.

9. The ion implanting apparatus of claim 7, further comprising a beam scanning part scanning the ion beam to uniformize the beam current according to the position of the ion beam, so that the ion beam is fed back to the beam current adjusting part before the ions are implanted into the substrate.

10. The ion implanting apparatus of claim 1, further comprising:
first and second measurement cell holding parts respectively holding the first and second measurement cells; and
a transferring apparatus transferring the substrate holding part and the first and second measurement cells at the same time.

11. The ion implanting apparatus of claim 10, wherein the first and second measurement cell holding parts are fixed to the substrate holding part, and
the transferring apparatus comprises:
a driving part; and
a power transmitting part transmitting the power of the driving part, to transfer the substrate holding part into a direction substantially opposite to the scanning direction.

12. The ion implanting apparatus of claim 11, wherein the driving part comprises one of a driving motor and a cylinder.

13. The ion implanting apparatus of claim 10, wherein the first and second measurement cell holding parts are separated from the substrate holding part, and
the transferring apparatus comprises:
a driving part; and
first, second and third power transmitting parts transmitting the power of the driving part, to respectively transfer the first and second measurement cell holding parts and the substrate holding part into a direction substantially opposite to the scanning direction at the same time.

14. A method for implanting ions, the method comprising:
generating an ion beam;
measuring ion doping quantity in real time during irradiating of the ion beam to a substrate;
controlling ion quantity of the ion beam based on the measured doping quantity; and
controlling a beam current based on the measured doping quantity according to a position of the ion beam;
wherein the measuring ion doping quantity includes;
measuring a plurality of first measured values at a first side of the substrate substantially parallel with a scanning direction of the ion beam;
outputting the first measured value;
measuring a plurality of second measured values at a second side of the substrate opposite to the first side of the substrate; and
outputting the second measured value.

15. The method of claim 14, wherein the beam current according to the position of the ion beam is controlled by uniformizing the beam current according to the position of the ion beam in real time through a difference between the first and second measured values.

16. The method of claim 15, wherein the ion beam is uniformized by:
applying a lower intensity of a magnetic force to a position where a higher ion doping quantity is measured than the previous position; and
applying a higher intensity of the magnetic force to a position where a lower ion doping quantity is measured than the previous position.

17. The method of claim 14, wherein the ion quantity of the ion beam is controlled by changing the ion quantity of the ion beam in real time through a difference between an average of the first and second measured values corresponding to substantially same ion beam and a predetermined reference.

18. The method of claim 17, wherein the ion quantity of the ion beam is controlled by:
   increasing the ion quantity when the average is lower than the predetermined reference; and
   decreasing the ion quantity when the average is higher than the predetermined reference.

19. The method of claim 14, further comprising measuring and adjusting the beam current according to the position of the ion beam to increase uniformity of the ion beam before the ion beam is irradiated onto the substrate.

* * * * *